US008138781B2

(12) United States Patent
Wang et al.

(10) Patent No.: US 8,138,781 B2
(45) Date of Patent: Mar. 20, 2012

(54) TEST CIRCUIT ADAPTED IN A DISPLAY PANEL OF AN ELECTRONIC DEVICE

(75) Inventors: Xiao-Lin Wang, Suzhou (CN); Ting-Ting Liu, Suzhou (CN); Jie Xi, Suzhou (CN)

(73) Assignees: AU Optronics (Suzhou) Corp., Ltd., Suzhou (CN); AU Optronics Corporation, Hsin-Chu (TW)

( * ) Notice: Subject to any disclaimer, the term of this patent is extended or adjusted under 35 U.S.C. 154(b) by 622 days.

(21) Appl. No.: 12/346,852

(22) Filed: Dec. 31, 2008

(65) Prior Publication Data

US 2010/0073009 A1 Mar. 25, 2010

(30) Foreign Application Priority Data

Sep. 23, 2008 (CN) .......................... 2008 1 0165782

(51) Int. Cl.
*G01R 31/26* (2006.01)

(52) U.S. Cl. .................................... 324/760.02; 349/40

(58) Field of Classification Search ........................ None
See application file for complete search history.

(56) References Cited

U.S. PATENT DOCUMENTS

| | | | | |
|---|---|---|---|---|
| 6,538,708 | B2 * | 3/2003 | Zhang | 349/40 |
| 6,791,632 | B2 * | 9/2004 | Lee et al. | 349/40 |
| 7,619,346 | B2 | 11/2009 | Yazdi | |
| 2003/0210359 | A1 | 11/2003 | Lee | |
| 2006/0077162 | A1 | 4/2006 | Chou | |

FOREIGN PATENT DOCUMENTS

| | | | |
|---|---|---|---|
| CN | 1877666 | A | 12/2006 |
| CN | 100399133 | C | 7/2008 |

* cited by examiner

*Primary Examiner* — Paresh Patel
(74) *Attorney, Agent, or Firm* — CKC & Partners Co., Ltd.

(57) ABSTRACT

A test circuit adapted in a display panel of an electronic device is provided. The test circuit is to test the pixel array function of the display panel, wherein the test circuit comprises: a plurality of test signal lines, a plurality of test signal transmitters, a plurality of gate lines and at least one static electricity protection device. The test signal lines receive a plurality of corresponding test signals respectively. The test signal transmitters comprises a plurality test signal transmitter groups comprising at least one transmitter, wherein each transmitter group corresponds to a test signal line and connects the test signal line and the to pixel array. Each gate line connects to the gate of the at least one transmitter. The static electricity protection device is placed between two of the gate lines.

16 Claims, 6 Drawing Sheets

TEST CIRCUIT ADAPTED IN A DISPLAY PANEL OF AN ELECTRONIC DEVICE

RELATED APPLICATIONS

This application claims priority to China Application Serial Number 200810165782.9, filed Sep. 23, 2008, which is herein incorporated by reference.

BACKGROUND

1. Field of Invention

The present invention relates to a test circuit. More particularly, the present invention relates to a test circuit to test the pixel array function of a display panel.

2. Description of Related Art

Display panels are extensively used as computer monitors, televisions and as screens for mobile devices, etc. Besides the design of the pixel array and the drive circuit in the display panel, the test circuit is also an important issue in the manufacturing process of the display panel. The test circuit tests the function without affecting the normal operation of the pixel array of the display panel.

A conventional test circuit connects the test signal lines directly to the pixel array and the drive circuit. After the test process, a laser cut process is performed to cut off the test signal lines. The laser cut process raises the cost of the manufacturing process. Further, if the laser cut process doesn't completely cut off the test signal lines, the connection of the test signal lines, pixel array and the drive circuit may cause abnormal display result. Another conventional design of the test circuit is to place a transistor between the connection of the test signal circuit and the pixel array and between the connection of test signal circuit and the drive circuit. Each transistor acts as a switch to turn off during the normal operation of the pixel array and the drive circuit. However, the transistor may suffer from static electricity and further cause damage to the pixel array and the drive circuit. Also, the difference of the manufacturing process among the transistors is easy to make a mura situation on the display panel when the test signals are fed.

Accordingly, what is needed is a test circuit to prevent the static electricity and lower the effect of the difference between the transistors to overcome the above issues. The present invention addresses such a need.

SUMMARY

A test circuit to test the pixel array function of a display panel is provided. The test circuit comprises a plurality of test signal lines, a plurality of test signal transmitters, a plurality of gate lines and at least one static electricity protection device. The plurality of test signal transmitters comprise a plurality of test signal transmitter groups each comprising at least one transmitter, wherein each transmitter group corresponds to a test signal line and connects the test signal line and the pixel array and each transmitter comprises at least one transmission gate. The plurality of gate lines each connects to the gate of at least one transmitter; and the at least one static electricity protection device is placed between two of the gate lines.

Another object of the present invention is to provide a display panel comprising a pixel array and a test circuit. The test circuit comprises a plurality of test signal lines, a plurality of test signal transmitters, a plurality of gate lines and at least one static electricity protection device. The plurality of test signal transmitters comprises a plurality test signal transmitter groups each comprising at least one transmitter, wherein each transmitter group corresponds to a test signal line and connects the test signal line and the pixel array and each transmitter comprises at least one transmission gate. The plurality of gate lines each connects to the gate of the at least one transmitter; and the at least one static electricity protection device is placed between two of the gate lines.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
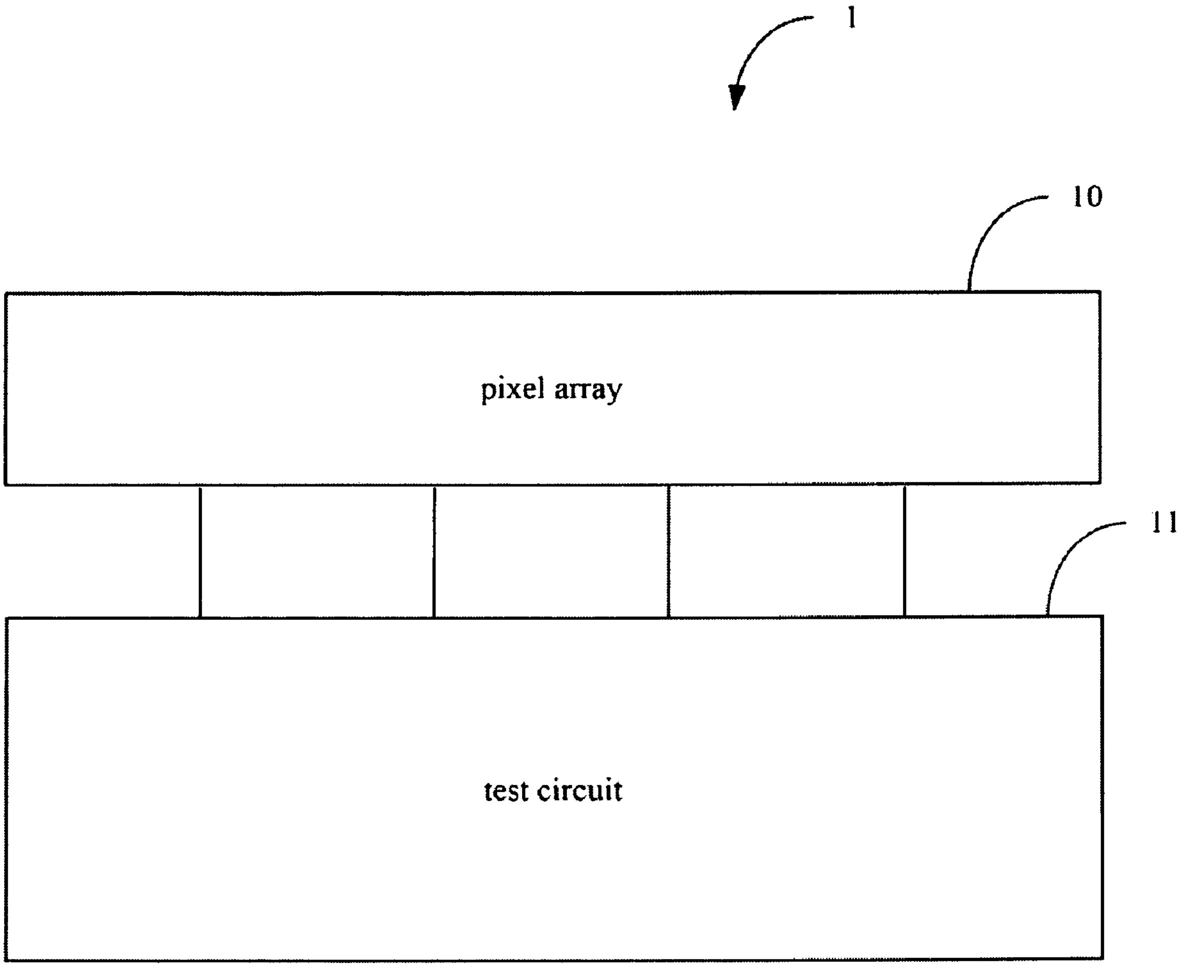
FIG. 1 is a block diagram of the display panel of the first embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
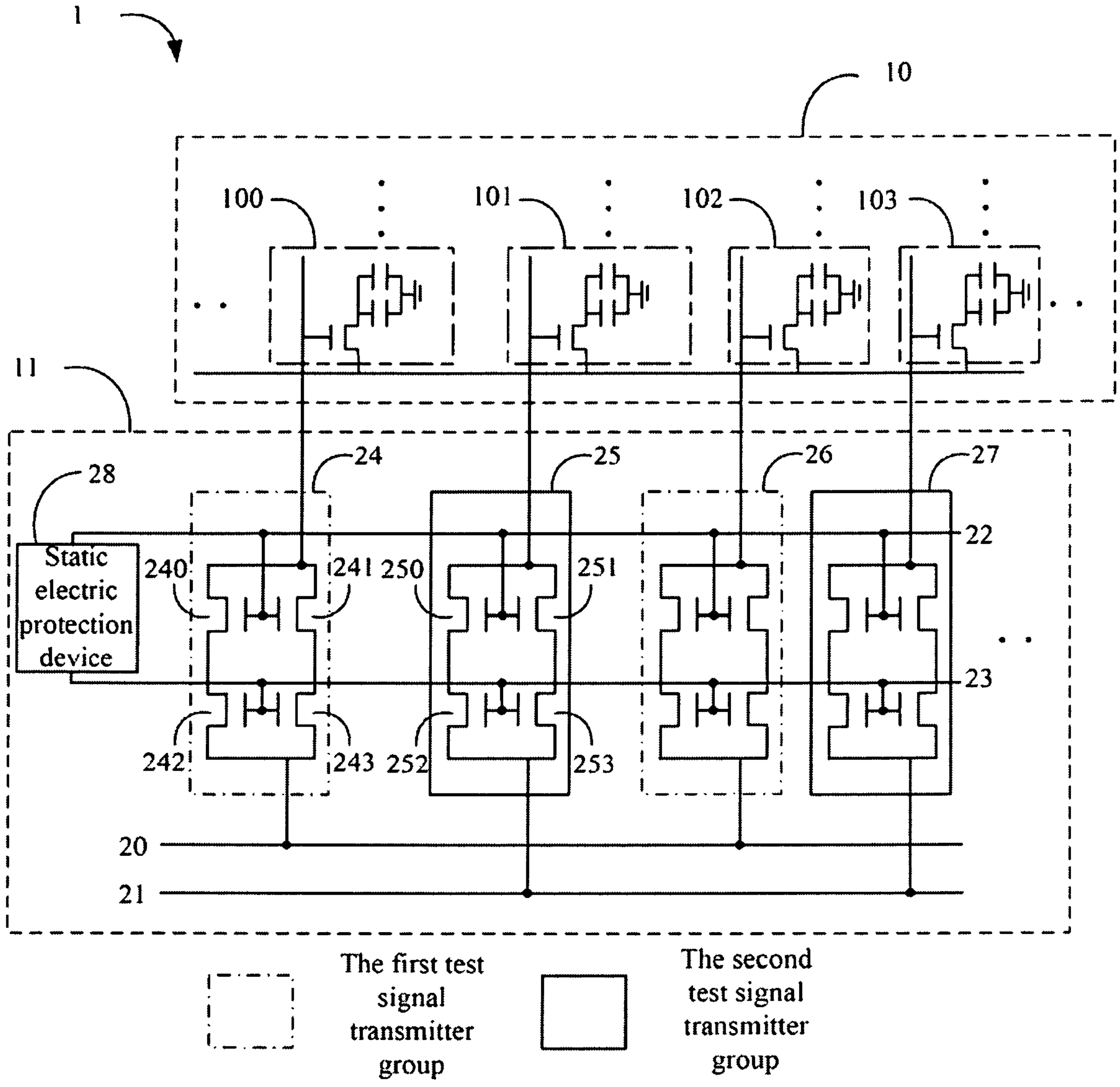
FIG. 2 is a circuit diagram of the display panel of the first embodiment of the present invention.

Please refer to FIG. 1. FIG. 1 is a block diagram of the display panel 1 of the first embodiment of the present invention. The display panel 1 is adapted in an electronic device (not shown), wherein the electronic device further comprises a host (not shown). The display panel 1 comprises a pixel array 10 and a test circuit 11. Please refer to FIG. 2 at the same time. FIG. 2 is a circuit diagram of the display panel 1 of the first embodiment of the present invention. The pixel array 10 comprises a plurality of pixels. In FIG. 2, only four pixels 100, 101, 102 and 103 are shown. The test circuit 11 comprises two test signal lines 20 and 21, a plurality of test signal transmitters, two gate lines 22 and 23 and a static electricity protection device 28. In FIG. 2, only four test signal transmitters 24, 25, 26 and 27 are shown. The test signal line 20 and 21 are an odd and an even gate test signal lines 20 and 21, respectively. The odd gate test signal line 20 receives an odd gate test signal, and the even gate test signal line 21 receives an even gate test signal. The test signal transmitters 24, 25, 26 and 27 comprise two test signal transmitter groups each corresponding to a test signal line. In the present embodiment, the first test signal transmitter group comprises the test signal transmitters 24 and 26 circulated by a dash-line respectively. The second test signal transmitter group comprises the test signal transmitters 25 and 27 circulated by a full-line respectively. The first and second test signal transmitter groups are arranged in an interlace manner as depicted in FIG. 2, wherein the test signal transmitters 24 and 26 in the first test signal transmitter group receive the odd gate test signal and connect to the gates of the transmitters in the pixels 100 and 102 in the odd row of the pixel array 10. The test signal transmitters 25 and 27 in the second test signal transmitter group receive the even gate test signal and connect to the gates of the transmitters in the pixels 101 and 103 in the even row of the pixel array 10. The test circuit 11 sends the odd gate test signal through the odd gate test signal line 20 and the first test signal transmitter group into the corresponding pixels in the pixel array 10 and sends the even gate test signal through the even gate test signal line 21 and the second test signal transmitter group into the corresponding pixels in the pixel array 10 to perform the test process.

In the present embodiment, the test signal transmitters 24, 25, 26 and 27 each comprises four transmission gates. Take the test signal transmitters 24 and 25 as examples, the test signal transmitters 24 comprises transmission gates 240, 241, 242 and 243, and the test signal transmitter 25 comprises transmission gates 250, 251, 252 and 253. The gate line 22 is electrically connected to the gates of the transmission gates 240, 241, 250 and 251, and the gate line 23 is electrically connected to the gates of the transmission gates 242, 243, 252 and 253. The static electricity protection device 28 is placed between the gate lines 22 and 23. If the static electricity gets in to the display panel 1 from the gate lines 22 and 23, the static electricity protection device 28 absorbs or dissipates the static electricity to protect the test signal transmitters 24, 25, 26 and 27 and the pixel array 10 from the damage caused by the static electricity.

Each transmission gate has different parameters due to the difference caused by the manufacturing process. Thus, if each test signal transmitter comprises only one transmission gate, the test signal sent into different rows in the pixel array through different transmission gates may generate an undesirable result. Thus, four transmission gates in the present invention average the parameters of the transmission gates to make the parameters of each test signal transmitters become similar. Thus, the test result will be more reliable.

Figure 3:
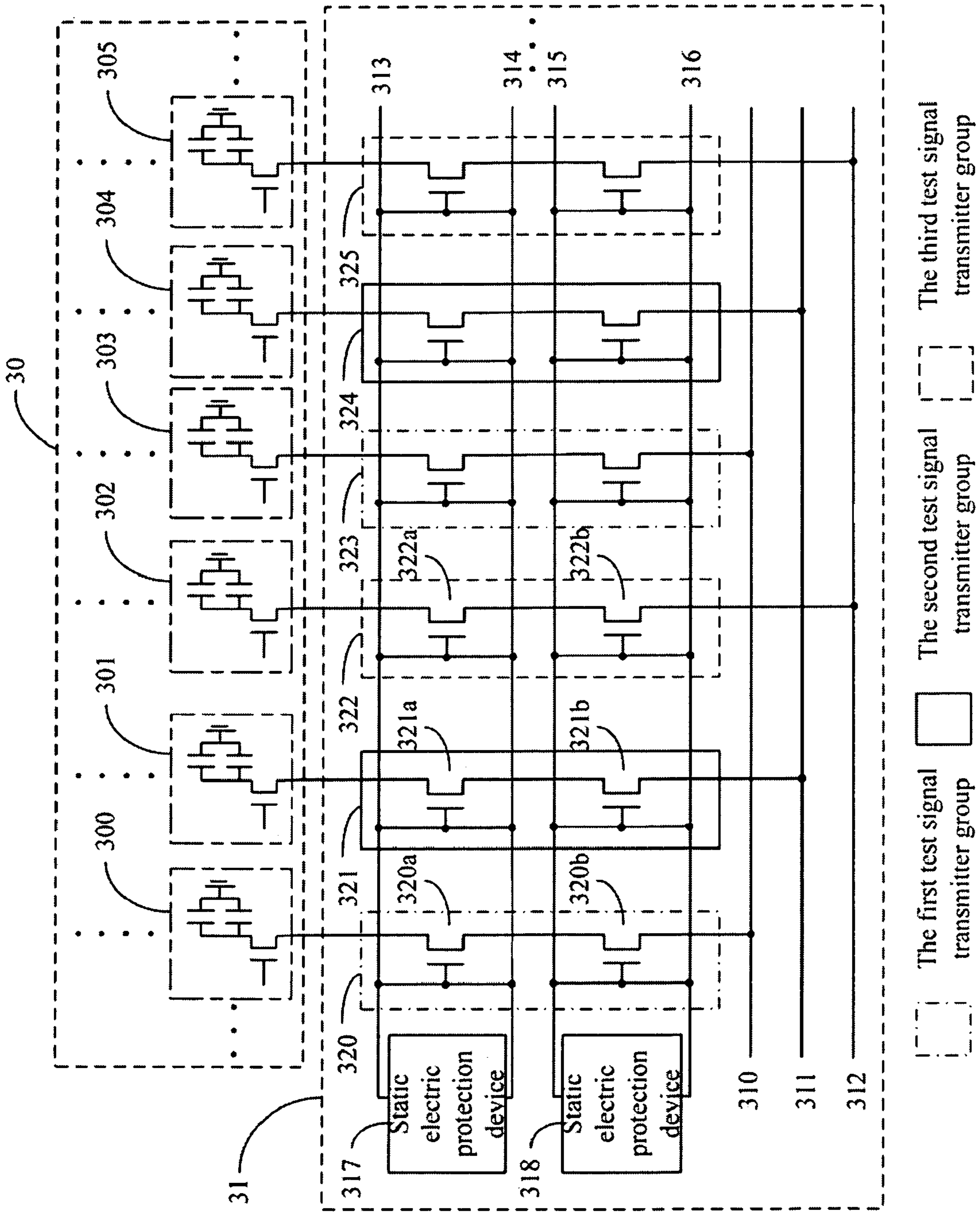
FIG. 3 is a circuit diagram of the display panel of the second embodiment of the present invention.

FIG. 3 is a circuit diagram of the display panel 3 of the second embodiment of the present invention. The display panel 3 comprises a pixel array 30 and a test circuit 31. The pixel array 30 comprises a plurality of pixels. In FIG. 3, only six pixels 300-305 are depicted. The test circuit 31 comprises: three test signal lines 310, 311 and 312, a plurality of test signal transmitters, four gate lines 313, 314, 315 and 316 and two static electricity protection devices 317 and 318. In FIG. 3, only six test signal transmitters 320-325 are shown. The test signal lines 310, 311 and 312 are a red, a green and a blue pixel test signal lines 310, 311 and 312, respectively. The red pixel test signal line 310 receives a red pixel test signal, the green pixel test signal line 311 receives a green pixel test signal and the blue pixel test signal line 312 receives a blue pixel test signal.

The test signal transmitters 320-325 comprise three test signal transmitter groups each corresponding to a test signal line. In the present embodiment, the first test signal transmitter group comprises the test signal transmitters 320 and 323 circulated by a dash-line respectively. The second test signal transmitter group comprises the test signal transmitters 321 and 324 circulated by a full-line respectively. The third test signal transmitter group comprises the test signal transmitters 322 and 325 circulated by another kind of dash-line respectively. The first, second and third test signal transmitter groups are arranged in an interlace manner as depicted in FIG. 3, wherein the test signal transmitters 320 and 323 in the first test signal transmitter group receive the red pixel test signal and connect to the pixels 300 and 303 of the pixel array 30. The test signal transmitters 321 and 324 in the second test signal transmitter group receive the green pixel test signal and connect to the pixels 301 and 304 of the pixel array 30. The test signal transmitters 322 and 325 in the third test signal transmitter group receive the blue pixel test signal and connect to the pixels 302 and 305 of the pixel array 30. Thus, a pixel display test can be performed.

Each of test signal transmitters 320-325 in the present embodiment comprises two transmission gates connected in a serial manner. Take the test signal transmitters 320-322 for example, the test signal transmitter 320 comprises two transmission gates 320*a* and 320*b*, the test signal transmitter 321 comprises two transmission gates 321*a* and 321*b* and the test signal transmitter 322 comprises two transmission gates 322*a* and 322*b*. The gate lines 313 and 314 are electrically connected to the gates of the transmission gates 320*a*, 321*a* and 322*a*. The gate lines 315 and 316 are electrically connected to the gates of the transmission gates 320*b*, 321*b* and 322*b*. The static electricity protection device 317 is placed between the gate lines 313 and 314. The static electricity protection device 318 is placed between the gate lines 315 and 316. If the static electricity gets in to the display panel 1 from the gate lines 313, 314 or 315, the static electricity protection devices 317 and 318 absorb or dissipate the static electricity to protect the test signal transmitters 320-322 and the pixel array 30 from the damage caused by the static electricity.

Figure 4A:
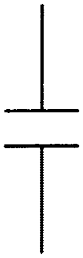
FIG. 4A to FIG. 4G are the diagrams of the static electricity protection devices in different embodiments of the present invention.
Figure 4B:
Figure 4C:
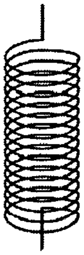
Figure 4D:
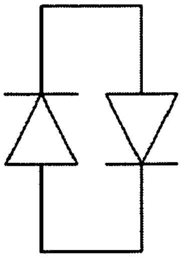
Figure 4E:
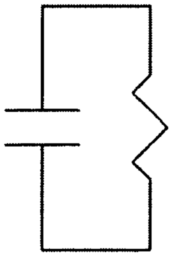
Figure 4F:
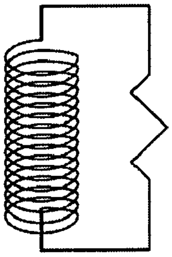
Figure 4G:
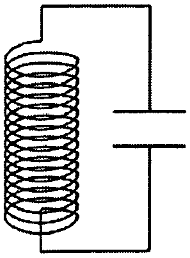

The static electricity protection device in the embodiments described above can be a capacitor as depicted in FIG. 4A. The capacitor can store the electric charge of the static electricity. In another embodiment, the static electricity protection device is a point discharge device as depicted in FIG. 4B, wherein the point discharge device performs an electric discharge process to dissipate the static electricity. In FIG. 4C, the static electricity protection device is an inductor to store the electric charge of the static electricity. In FIG. 4D, the static electricity protection device comprises two anti-parallel diodes to absorb the static electricity from different directions. Further, the static electricity protection device can be a combination of capacitor, inductor and resistor, such as a RC circuit in FIG. 4E, a RL circuit in FIG. 4F or a LC circuit in FIG. 4G. In other embodiments, the static electricity protection device can be an electrostatic discharge integrated circuit to perform dissipation or absorption of the static electricity more efficiently.

Figure 5A:
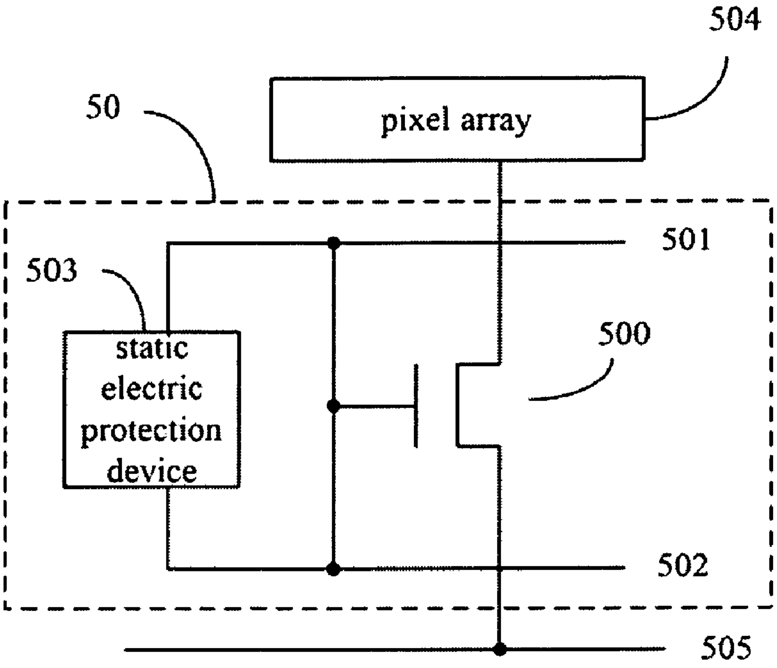
FIG. 5A to FIG. 5D are the diagrams of the test signal transmitters in different embodiments of the present invention.
Figure 5B:
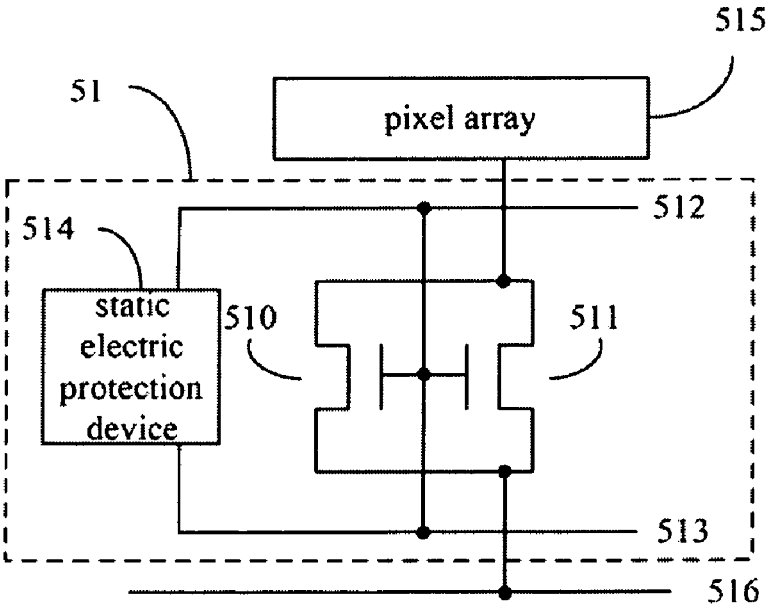
Figure 5C:
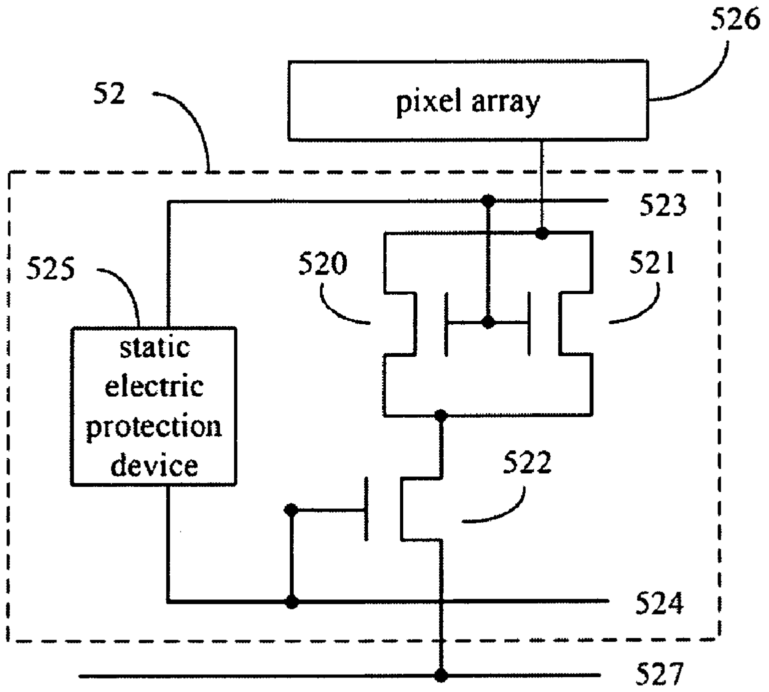
Figure 5D:
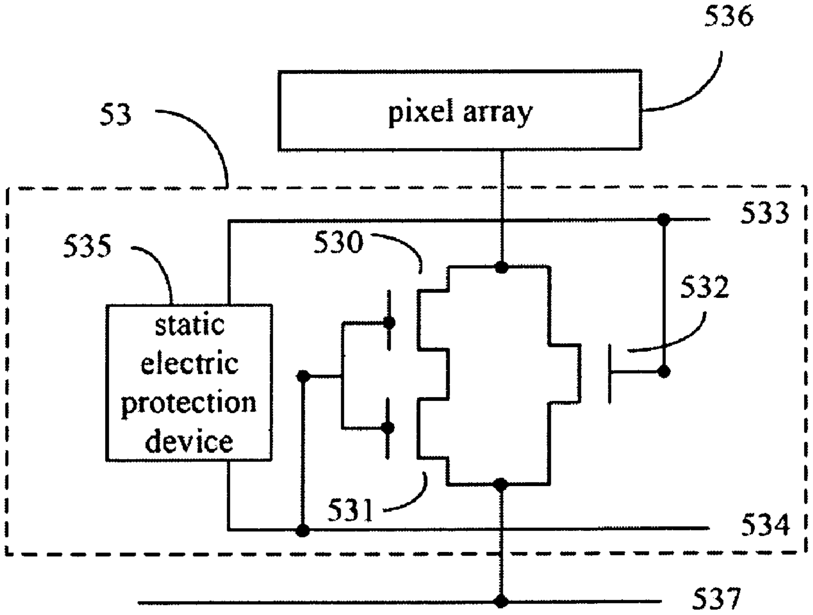

In other embodiment, the number and the connection type of the transmission gates of the test signal transmitters can be different in different situations. In FIG. 5A, the test signal transmitters 50 comprises only one transmission gate 500 connected to the static electricity protection device 503 through two gate lines 501 and 502. The transmission gate 500 also electrically connects to the pixel array 504 and the test signal line 505. The test signal transmitter 51 in FIG. 5B comprises two transmission gates 510 and 511 connected in parallel. The two transmission gates 510 and 511 further electrically connect to the static electricity protection device 514 through two gate lines 512 and 513. The transmission gates 510 and 511 also electrically connect to the pixel array 515 and the test signal line 516. The test signal transmitter 52 in FIG. 5C comprises three transmission gates 520, 521 and 522, wherein the transmission gates 520 and 521 connect in parallel first and further serially connect to the transmission gate 522. The three transmission gates 520, 521 and 522 further electrically connect to the static electricity protection device 525 through two gate lines 523 and 524. The transmission gates 520 and 521 also electrically connect to the pixel array 526, and the transmission gate 522 connects to the test signal line 527. The test signal transmitter 53 in FIG. 5D comprises three transmission gates 530, 531 and 532, wherein the transmission gates 530 and 531 serially connect to each other first and further connect to the transmission gate 532 in parallel. The three transmission gates 530, 531 and 532 further electrically connect to the static electricity protection device 535 through two gate lines 533 and 534. The transmission gates 530 and 532 also electrically connect to the pixel array 536, and the transmission gates 531 and 532 connect to the test signal line 537. The test signal transmitter comprising a plurality of transmission gates can still work if a part of the transmission gates is damaged due to the static electricity. When the test signal transmitter comprises more than four transmission gates, the transmission gates can be a combination of a plurality of parallel and serial connections.

The test circuit of the present invention provides a mechanism to prevent the static electricity with the use of the static electricity protection device and lower the effect of the difference among the transistors with different implementations of the test signal transmitter.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A test circuit to test the pixel array function of a display panel, wherein the test circuit comprises:

a plurality of test signal lines;

a plurality of test signal transmitters comprising a plurality test signal transmitter groups each comprising at least one transmitter, wherein each transmitter group corresponds to a test signal line and connects the test signal line and the pixel array and each transmitter comprises at least one transmission gate;

a plurality of gate lines each connecting to the gate of the at least one transmitter; and at least one static electricity protection device placed between two of the gate lines.

2. The test circuit of claim 1, wherein each gate line connects to the gate of the at least one transmission gate of each transmitter in one of the test signal transmitter groups.

3. The test circuit of claim 2, wherein each transmitter comprises at least two transmission gates, each gate line connects to the gates of the at least two transmission gates of each transmitter in one of the test signal transmitter groups, and the at least two transmission gates are parallel connected.

4. The test circuit of claim 1, wherein each transmitter comprises at least two transmission gates, the at least two transmission gates are at least one serial connected structure or at least one parallel connected structure.

5. The test circuit of claim 1, wherein each transmitter comprises at least three transmission gates, where all the transmission gates are a combination of at least one serial connected structure and at least one parallel connected structure.

6. The test circuit of claim 1, wherein the plurality of test signal lines comprises a red pixel test signal line, a green pixel test signal line and a blue pixel test signal line, and the plurality of test signal transmitters comprises three test signal transmitter groups each corresponding to the red, green and blue pixel test signal lines respectively.

7. The test circuit of claim 1, wherein the pixel array comprises a plurality of data lines each corresponding to one of the plurality of test signal transmitters.

8. The test circuit of claim 1, wherein the plurality of test signal lines comprises an odd gate test signal line and an even gate test signal line, the plurality of test signal transmitters comprise two test signal transmitter groups corresponding to the odd and even test signal lines respectively.

9. The test circuit of claim 1, wherein the pixel array comprises a plurality of gate lines each corresponding to a test signal transmitters.

10. The test circuit of claim 1, wherein the at least one static electricity protection device is a capacitor.

11. The test circuit of claim 1, wherein the at least one static electricity protection device is a point discharge device.

12. The test circuit of claim 1, wherein the at least one static electricity protection device is an inductor.

13. The test circuit of claim 1, wherein the at least one static electricity protection device comprises two anti-parallel diodes.

14. The test circuit of claim 1, wherein the at least one static electricity protection device is a RC circuit, a RL circuit or a LC circuit.

15. The test circuit of claim 1, wherein the at least one static electricity protection device is an electrostatic discharge integrated circuit.

16. A display panel comprising:

a pixel array; and a test circuit comprising:

a plurality of test signal lines;

a plurality of test signal transmitters comprising a plurality test signal transmitter groups each comprising at least one transmitter, wherein each transmitter group corresponds to a test signal line and connects the test signal line and the pixel array and each transmitter comprises at least one transmission gate;

a plurality of gate lines each connecting to the gate of the at least one transmitter; and at least one static electricity protection device placed between two of the gate lines.

* * * * *